(12) United States Patent
Mogaveera

(10) Patent No.: US 9,164,128 B2
(45) Date of Patent: Oct. 20, 2015

(54) ELECTROSTATIC SHIELDING TECHNIQUE ON HIGH VOLTAGE RESISTOR

(75) Inventor: Vasu Mogaveera, Andhra Pradesh (IN)

(73) Assignee: Honeywell International Inc., Morristown, NJ (US)

( * ) Notice: Subject to any disclaimer, the term of this patent is extended or adjusted under 35 U.S.C. 154(b) by 880 days.

(21) Appl. No.: 13/235,966

(22) Filed: Sep. 19, 2011

(65) Prior Publication Data

US 2013/0069677 A1 Mar. 21, 2013

(51) Int. Cl.
*G01R 27/08* (2006.01)
*G01R 1/18* (2006.01)
*G01R 1/20* (2006.01)
*G01R 15/14* (2006.01)
G01R 1/067 (2006.01)
G01R 1/07 (2006.01)

(52) U.S. Cl.
CPC *G01R 1/18* (2013.01); *G01R 1/203* (2013.01); *G01R 15/14* (2013.01); *G01R 1/06777* (2013.01); *G01R 1/06788* (2013.01); *G01R 1/07* (2013.01)

(58) Field of Classification Search
CPC ..... G01R 1/06777; G01R 15/14; G01R 1/203
USPC ........ 324/710–720, 600, 76.11, 457, 90, 316, 324/322, 347, 358, 415, 72.5
See application file for complete search history.

(56) References Cited

U.S. PATENT DOCUMENTS

| | | | |
|---|---|---|---|
| 3,239,751 A | 3/1966 | Sibary | |
| 3,317,659 A | 5/1967 | Frey | |
| 3,335,449 A * | 8/1967 | Faessinger et al. | 15/104.93 |
| 4,034,283 A | 7/1977 | Pellegrino | |
| 5,008,913 A | 4/1991 | Negle | |
| 5,136,243 A * | 8/1992 | Starewicz et al. | 324/318 |
| 2003/0024734 A1* | 2/2003 | Ineson et al. | 174/260 |
| 2006/0087314 A1* | 4/2006 | Zhu et al. | 324/207.17 |
| 2006/0109033 A1 | 5/2006 | Sundaram | |

* cited by examiner

*Primary Examiner* — Melissa Koval
*Assistant Examiner* — Trung Nguyen
(74) *Attorney, Agent, or Firm* — Wood, Phillips, Katz Clark & Mortimer

(57) ABSTRACT

A phasing voltage meter comprises first and second probes. Each probe comprises an insulated shield supporting an electrode for contacting a high voltage electrical conductor. The shield houses a high voltage resistor connected in series with the electrode. A capacitance formed by a metallic collar across the resistor compensates for stray capacitance across the resistor. A meter comprises a housing enclosing electrode circuit for measuring phasing voltage. The electrical circuit measures voltage across the electrodes and provides an output representing phasing voltage.

20 Claims, 6 Drawing Sheets

ELECTROSTATIC SHIELDING TECHNIQUE ON HIGH VOLTAGE RESISTOR

CROSS-REFERENCE TO RELATED APPLICATIONS

Not Applicable.

FEDERALLY SPONSORED RESEARCH OR DEVELOPMENT

Not Applicable.

MICROFICHE/COPYRIGHT REFERENCE

Not Applicable.

FIELD

This disclosure relates to a high voltage phasing meter with electrostatic shielding.

BACKGROUND

Electrical power distribution systems often include overhead electrical power distribution lines mounted upon poles by a wide variety of mounting structure. Other distribution systems include underground distribution lines in which protected cables run under the ground surface. It is often necessary to take phase-to-phase or phase-to-ground voltage measurements across distribution and transmission lines while testing for induced or live power line or equipment.

Known high voltage safety line detectors, meters and testers comprise high resistance probes connected in series with a calibrated panel meter to read the voltage across the phase-to-phase or phase-to-ground terminals. They are designed for use as safety tools by high voltage line maintenance workers to verify the status of the line or equipment as nominal, induced or de-energized voltage. Known devices for providing such measurements include contact type and non-contact type. With contact type a reference probe or transmitter and a meter probe or receiver are connected in series with a cable as the loop is closed with load terminals.

The high resistance probes include a high voltage resistor connected in series with an electrode. The voltage distribution along the length of the high voltage resistor is non-uniform due to stray capacitance. This can result in errors in voltage measurement and provide unequal electrical stress distribution along the high voltage resistor.

Particularly, the high voltage measurement is carried out by using high voltage resistors in the phasing meter. One type of phasing meter uses a micro ammeter method of measurement. The voltage applied across the resistor leads to current flow in a meter circuit and amount of current flow corresponds to the voltage being measured. Another method is known as the voltage divider method and the phasing meter includes high value resistors producing a high voltage drop and a low value resistor producing a low voltage drop. The line to line or line to ground high voltage is applied across the resistors which are in series and the voltage drop across the low value resistor corresponds to the actual voltage being measured.

A high voltage resistor used in a phasing meter may have a non-uniform voltage distribution along the length of the resistor and creates instability due to stray capacitance between resistance portions to ground. The voltage stress is not uniform across the length of the resistor due to stray capacitance. The voltage stress will be more than two times the uniform stress at the resistor end near to the high voltage side. This leads to degradation of the resistor material at these points. Also, due to stray capacitance, the current which is flowing through the circuit is not the same as the theoretically calculated current leading to voltage measurement errors. The total current should be the circuit and stray capacitive current. However, the actual current portion is diverted by the stray capacitance leading to the measurement error.

The disclosure is directed to improvements in high voltage phasing voltmeters.

SUMMARY

As described herein, a phasing voltage meter compensates for stray capacitance across the probe resistor.

Particularly, a phasing voltage meter comprises first and second probes. Each probe comprises an insulated shield supporting an electrode for contacting a high voltage electrical conductor. The insulated shield houses a high voltage resistor connected in series with the electrode. A capacitance, formed by metallic collars, across the resistor compensates for stray capacitance from the resistor to ground. A meter comprises a housing enclosing an electrical circuit for measuring phasing voltage. The electrical circuit measures voltage across the electrodes and provides an output representing phasing voltage.

It is a feature that the capacitance comprises a first metallic collar at one end of the high voltage resistor and a second metallic collar at an opposite end of the high voltage resistor. The first metallic collar may be of a different size than the second metallic collar. The first metallic collar may be larger than the second metallic collar. The first metallic collar may have a greater diameter than the second metallic collar. The first metallic collar may have a greater thickness than the second metallic collar.

It is a further feature that the first metallic collar and the second metallic collar support the high voltage resistor in the shield.

It is another feature that each probe comprises a handle portion at a near end of the shield. The meter housing is integral with the handle portion of the first probe.

It is still another feature that the first and second metallic collars are secured in the shield with a potting compound.

There is also disclosed a high voltage phasing meter comprising a first probe and a second probe. Each of the probes comprises an elongate insulated shield having a handle portion at one end. An electrode extends from a distal end of the insulated shield for contacting a high voltage electrical conductor. A high impedance circuit in the shield comprises a high voltage resistor and a capacitance, formed by metallic collars, across the high voltage resistor to provide uniform current for each section of the high voltage resistor. A meter comprises a housing enclosing an electrical circuit for measuring phasing voltage. The electrical circuit measures voltage across the electrodes and provides an output representing phasing voltage.

Other features and advantages will be apparent from a review of the entire specification, including the appended claims and drawings.

DETAILED DESCRIPTION

Figure 1:
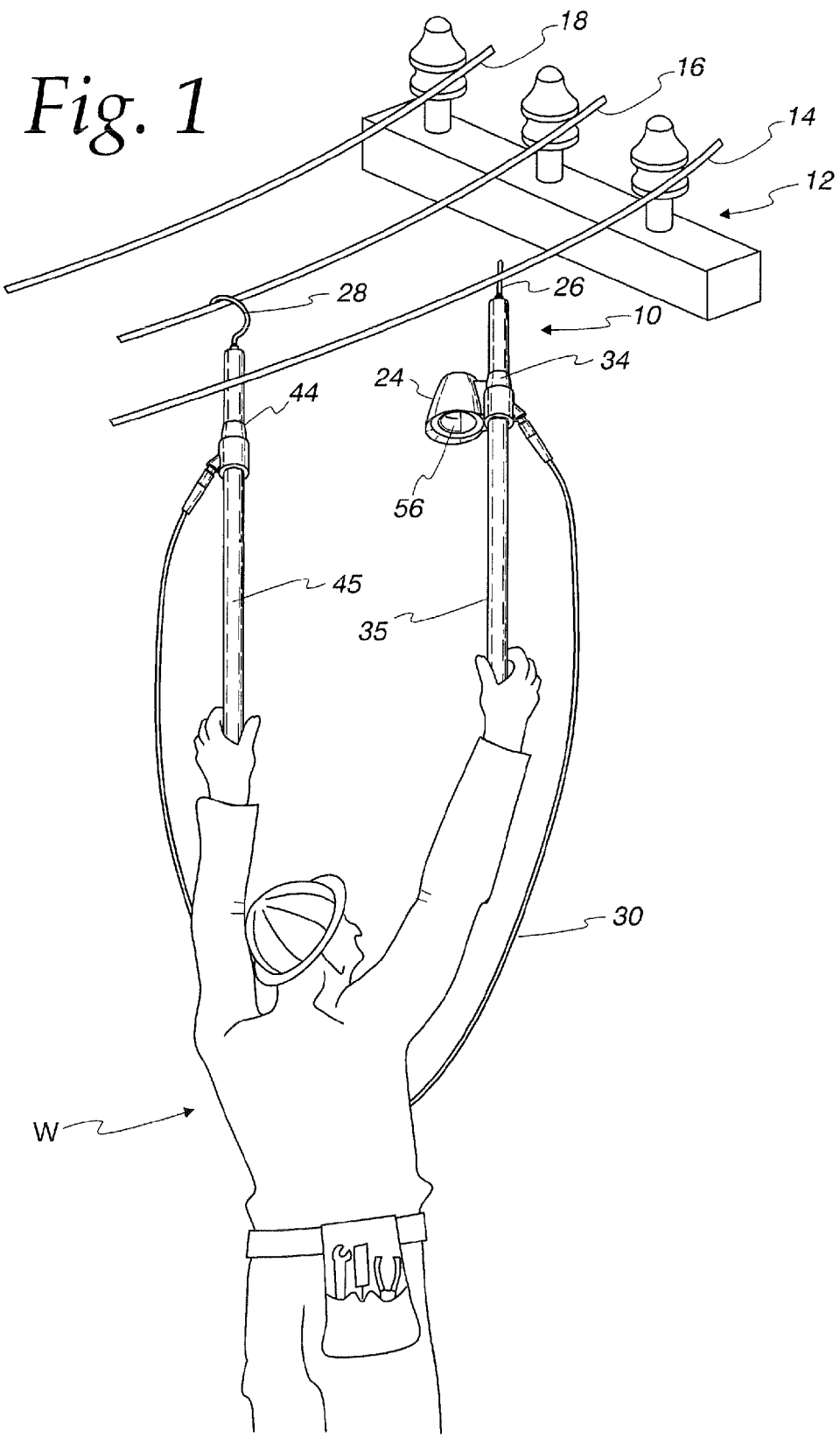
FIG. 1 is a perspective view of use of a high voltage phasing voltmeter as disclosed herein.

Referring initially to FIG. 1, a portable high voltage phasing voltage meter 10 is shown for measuring phase-to-phase voltage between lines in a high voltage distribution and transmission line system 12. The distribution and transmission line system 12 includes three lines in the form of conductors 14, 16 and 18 carrying high voltage power of alternating current with each line being 120° out of phase with the other lines, as is conventional. The phasing meter 10 may be used by a maintenance worker W for measuring phase-to-phase voltage such as between the electrical conductors 14 and 16 as illustrated in FIG. 1. The phasing meter 10 may also be used to measure other voltages, such as phase-to-neutral or phase-to-ground.

Figure 2:
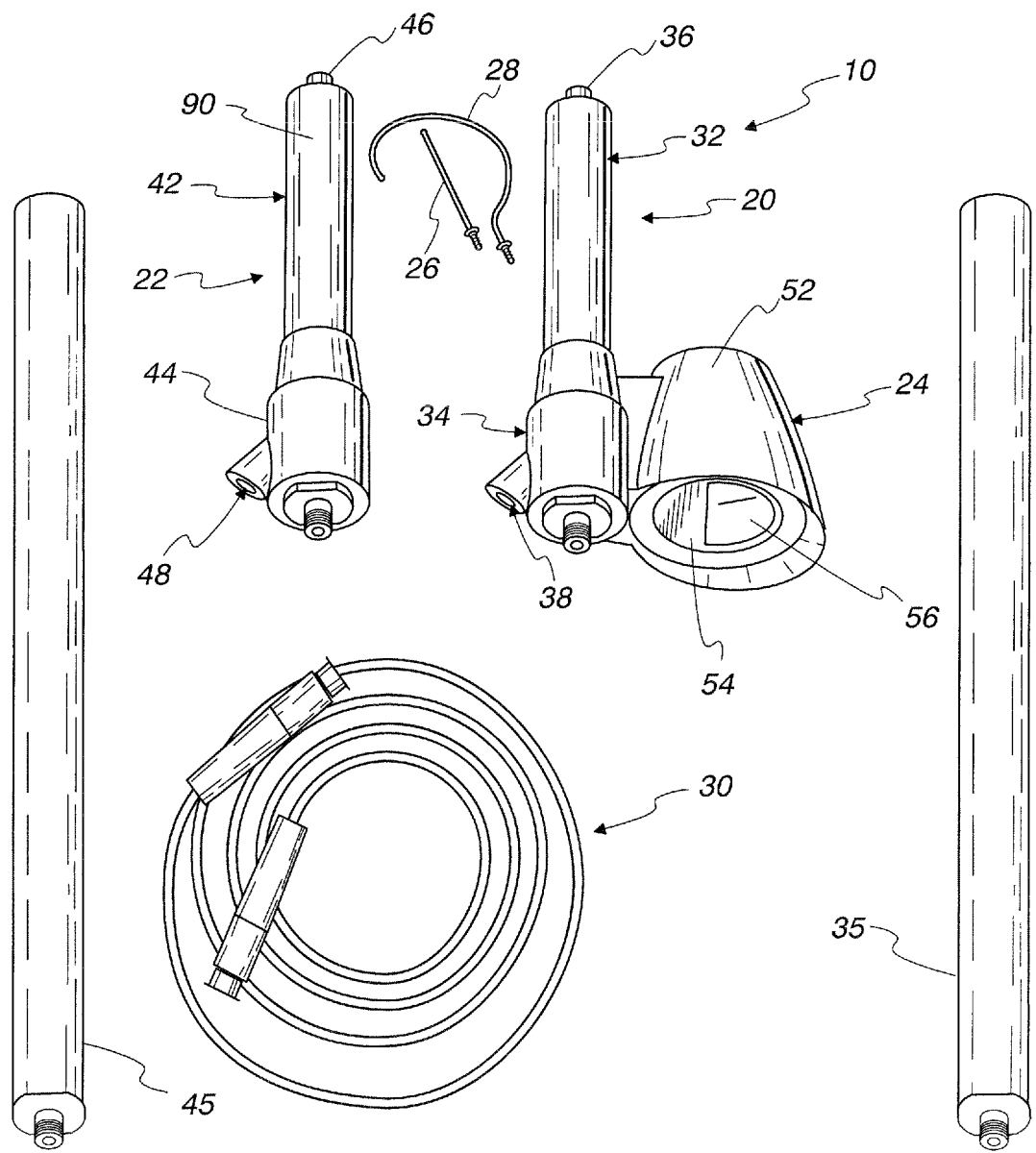
FIG. 2 is a perspective of the individual components of the high voltage phasing voltmeter of FIG. 1.

Referring also to FIG. 2, the meter 10 comprises a first probe 20, a second probe 22, a meter 24, a first electrode 26, and a second electrode 28.

The first probe 20 comprises an elongate insulated shield 32 connected to a handle portion 34 at a near end and a terminal 36 at an opposite distal end. An insulating hot stick 35 is selectively attached to the handle portion 34 to extend length of the first probe 20. The terminal 36 is adapted to threadably receive one of the electrodes 26 or 28. A coaxial connector 38 is provided in the handle portion 34 for receiving a first coaxial connector of a cable 30, see FIG. 1.

The second probe 22 comprises an elongate insulated shield 42 connected to a handle portion 44 at a near end and a terminal 46 at an opposite distal end. An insulating hot stick 45 is selectively attached to the handle portion 44 to extend length of the second probe 22. The terminal 46 is adapted to threadably receive the other of the electrodes 26 or 28. A coaxial connector 48 is provided in the handle portion 44 for receiving a second coaxial connector of the cable 30.

The meter 24 comprises a housing 52 integrally formed with the first probe handle portion 34. The housing 52 is frustoconical in shape including a bottom bezel 54 through which a display 56 is visible. The display 56 can be an analog display or a digital display, as preferred.

As shown in FIG. 1, the worker W can grip the hot sticks 35 and 45 to contact the lines 14 and 16 with the electrodes 26 and 28, respectively. The meter display 56 is visible to read the measured phase to phase voltage.

Figure 3:
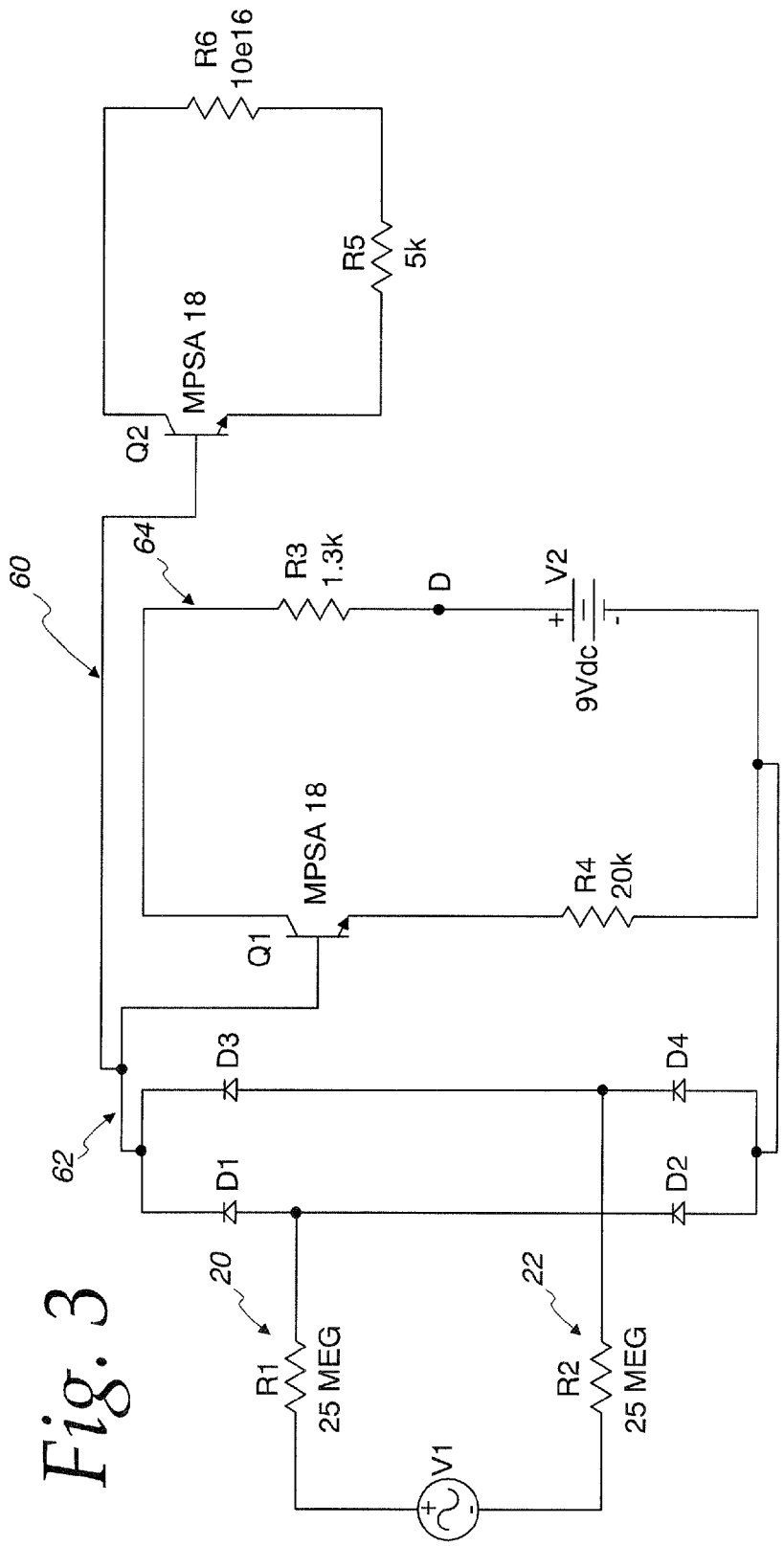
FIG. 3 is an electrical schematic of a high voltage phasing meter of the micro ammeter type.

Referring to FIG. 3, an electrical circuit 60 for the meter 24, see FIGS. 1 and 2, is illustrated. The electrical circuit 60 uses the micro ammeter method for measuring voltage. The first probe 20 comprises a first high voltage resistor R1. The second probe 22 comprises a second high voltage resistor R2. The voltage being measured, such as across the lines 14 and 16, see FIG. 1, is represented by V1. The probes 20 and 22 are connected via the cable 30, see FIG. 1, in a conventional manner, to the electrical circuit 60. The electrical circuit 60 includes a rectifier circuit 62 connected to the probe resistors R1 and R2. The electrical circuit 60 is powered by a battery V2. The battery V2 powers a measurement circuit 64 including a node D which drives the display 56 in a conventional manner.

Figure 4:
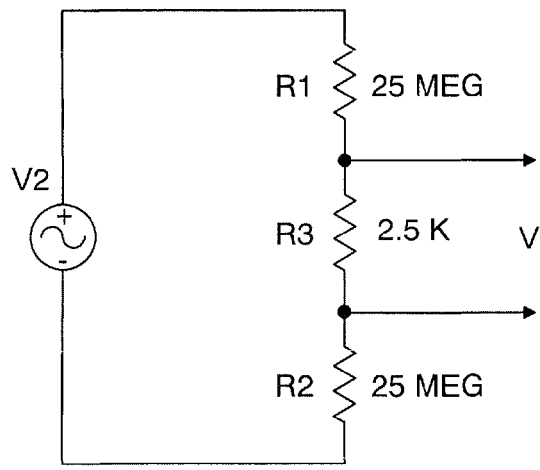
FIG. 4 is an electrical schematic of a portion of a high voltage phasing meter of the voltage divider type.

FIG. 4 illustrates a voltage divider type voltage measurement in which a low voltage resistor R3 is connected in series with the high voltage resistors R1 and R2. A meter electrical circuit, not shown, measures the voltage V0 across the low value resistor R3 in a conventional manner.

The probes described herein can be used in connection with either type of measurement circuit. In fact, the particular measurement circuit shown in FIGS. 3 and 4 are for illustration only as other types of circuits can be used, as will be apparent.

Figure 5:
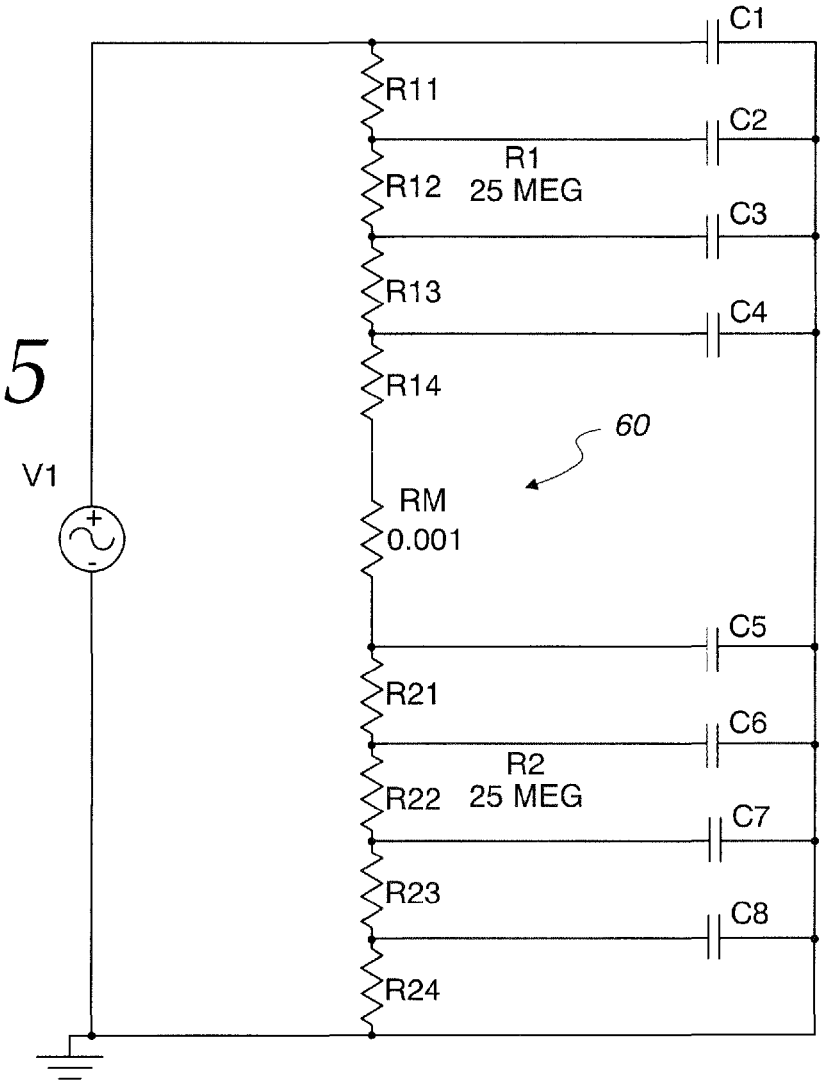
FIG. 5 is an electrical schematic illustrating stray capacitance effect on the high voltage resistors in an equivalent circuit for the embodiment of FIG. 3.

Referring to FIG. 5, the circuit of FIG. 3 is shown with the circuit 60 represented in equivalent form by a resistance RM. While each probe includes a respective high voltage resistor R1 and R2, each high voltage resistor has a given length in which it can utilize a discrete number of resistors of the same resistance value. These are referred to herein as resistor sections. In the illustrated schematic in FIG. 5, the resistor R1 is illustrated as discrete resistor sections R11, R12, R13 and R14 all in series. Similarly, the second high voltage resistor R2 is illustrated as discrete resistor sections R21, R22, R23 and R24, again all in series. Ideally, the current flowing through each resistor section should be equal to the current flowing through the resistance RM. However, this is not always the case due to stray capacitance represented by the capacitors C1, C2, C3 and C4 across the resistor sections to ground associated with the first high voltage resistor R1, and similarly, capacitance C5, C6, C7 and C8 across the resistance sections to ground of the second high voltage resistor R2. While the resistor sections R11-R14 and R21-R24 are assumed to be of equal values, the current through each resistor section is not equal due to the effect of the stray capacitance. This causes unequal voltage distribution along the length of the respective high voltage resistors R1 and R2 making electrical stresses non uniform. There will be greater stress at the side closest to the supply V1 and less at the side closest to the resistance RM. This stress distribution can lead to degrading of the resistors R1 and R2 and lead to failure over a period of time.

Figure 6:
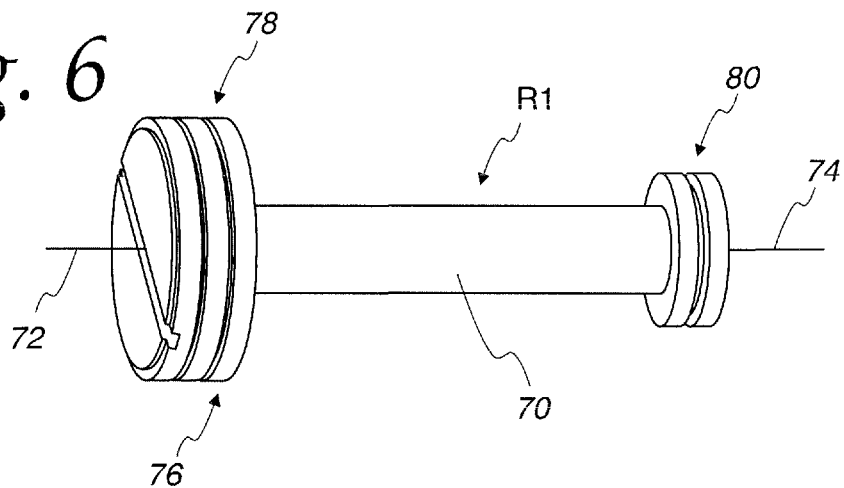
FIG. 6 is a perspective view of a high voltage resistor with a metallic collar attached for a probe as described herein.

Referring to FIG. 6, the first high voltage resistor R1 is illustrated as comprising an elongate resistor element 70 between opposite leads 72 and 74. As described herein, a capacitance 76, formed by metallic collars, is placed across the resistor R1 to compensate for stray capacitance and provide uniform current through each section of the high voltage resistor R1. The capacitance 76 is formed by a first metallic shield or collar 78 at one end of the resistor element 70 and a second metallic shield or collar 80 at an opposite end of the resistor element 70 to provide better voltage distribution. The first collar 78 is of a different size than the second collar 80. More particularly, the first collar 78 is larger than the second collar 80. In the illustrated embodiment, the first collar 78 has a diameter on the order of 22.5 mm and a thickness of 10 mm. The second collar 80 has a diameter of about 12 mm and a thickness of about 4 mm. As is apparent, other sizes could be used. The collars 78 and 80 sandwich the resistor element 70 with the leads 72 and 74 extending respectively therethrough.

Figure 7:
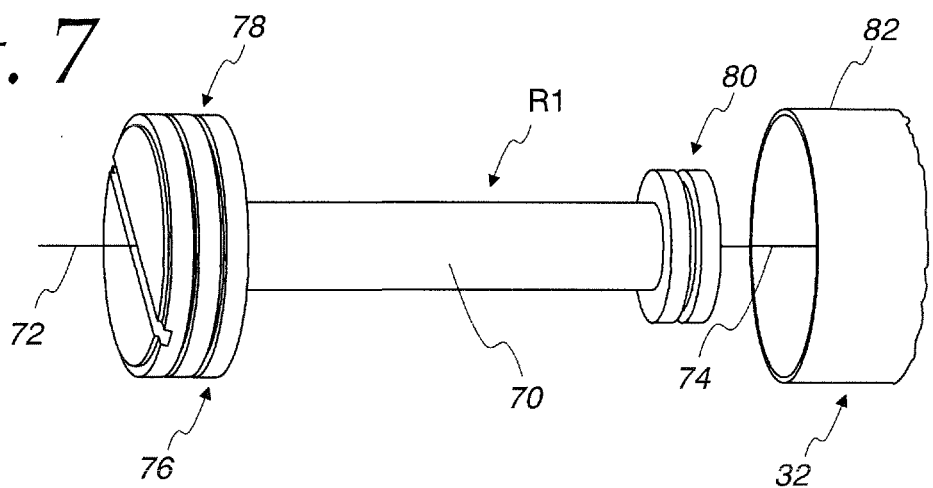
FIG. 7 is a perspective view similar to FIG. 6 showing alignment of the high voltage resistor with a metallic collar attached to be inserted into a shield.
Figure 8:
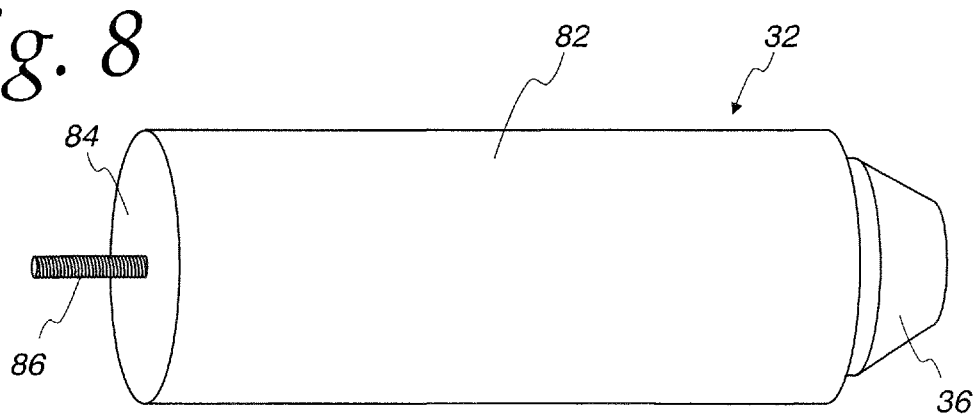
FIG. 8 is a perspective view, similar to FIG. 7, showing the assembled probe.

Referring to FIG. 7, the insulated shield 32 comprises an elongate cylindrical housing 82 of a size corresponding to the diameter of the first collar 78. The first high voltage resistor R1 with the collars 78 and 80 is inserted into the shield housing 82. A potting compound, represented at 84, is used to fill the housing 82 to secure the collars 78 and 80 in the shield housing 82 with the terminal 36 being secured to the second lead 74 in a conventional manner and a terminal 86 being secured to the first lead 72 in a conventional manner.

The second probe 22 is of similar design to the first probe 20 including the electrostatic shielding across the second high voltage resistor R2.

Figure 9:
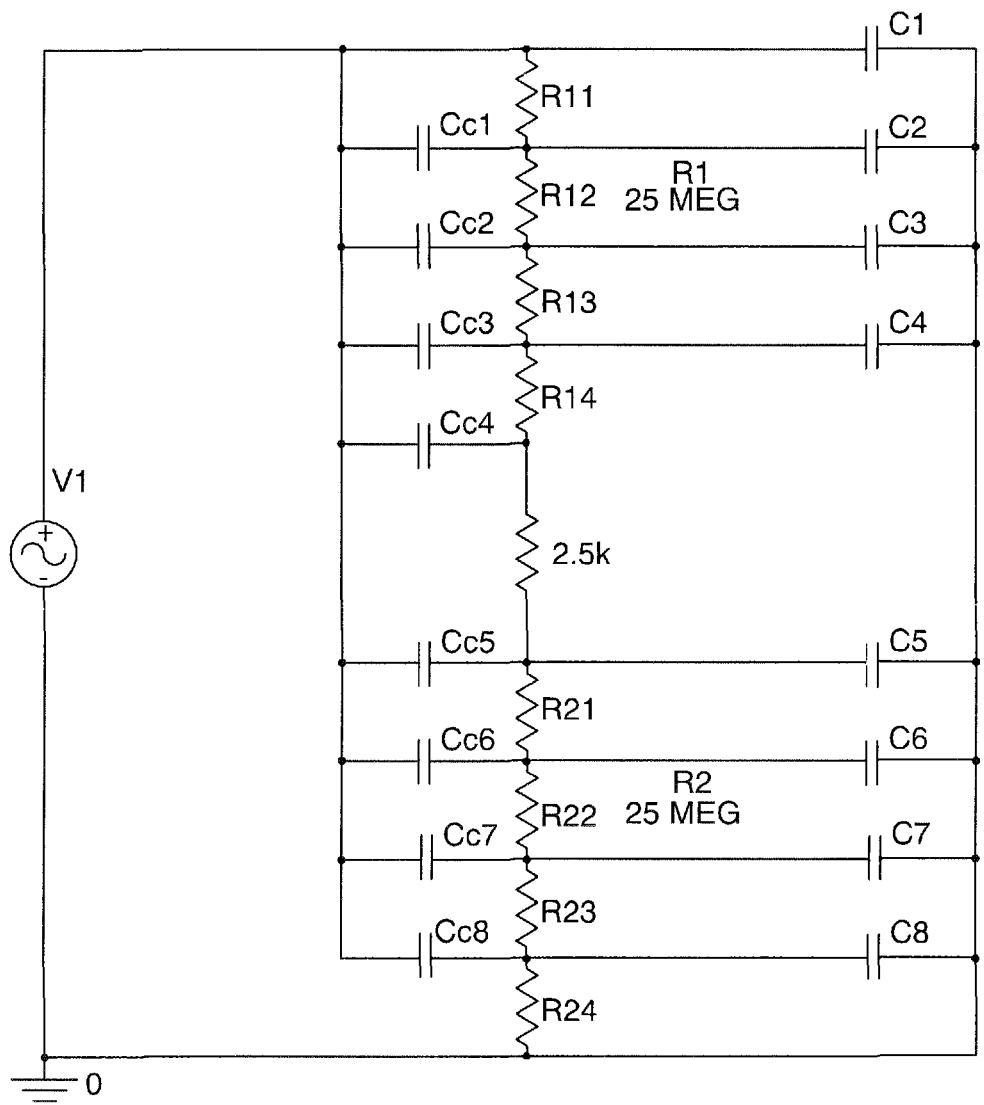
FIG. 9 is an electrical schematic, similar to FIG. 5, illustrating an electrostatic shielding technique as described herein.

The use of the metallic collars 78 and 80 having different diameters and thickness and placed at both ends of the high voltage resistors R1 and R2 forms capacitance from the collars 78 and 80 to the resistor sections of the high voltage resistors in the form of compensative capacitance. This is illustrated in FIG. 9 as capacitance components CC1-CC8 across the resistor elements R11-R14 and R21-R24. The current due to stray capacitance represented as C1-C8 will be approximately compensated by the metallic shielding compensative capacitive current. Thus, the voltage drop across each resistor section of the length of the resistors will be about equal.

Additionally, the collars 78 and 80 provide better mechanical support for the high voltage resistors R1 and R2 mounted in the respective probe shields 32 and 42. The epoxy potting of the shield housings makes it simpler for assembling with the shielded collars.

Thus, in accordance with the disclosed probes, there is a reduction in high voltage measurement error owing to stray capacitance effect being compensated. A better electrical stress distribution is provided along the length of the high voltage resistors R1 and R2 ensuring reliability of the resistors. Particularly, the stray capacitance effect is minimized by use of the metallic circular collars 78 and 80 placed at opposite ends of the high voltage resistance element 70. This makes the voltage distribution more linear and reduces the voltage error.

It will be appreciated by those skilled in the art that there are many possible modifications to be made to the specific forms of the features and components of the disclosed embodiments while keeping within the spirit of the concepts disclosed herein. Accordingly, no limitations to the specific forms of the embodiments disclosed herein should be read into the claims unless expressly recited in the claims. Although a few embodiments have been described in detail above, other modifications are possible. Other embodiments may be within the scope of the following claims.

The invention claimed is:

1. A phasing voltage meter comprising:
   first and second probes, each comprising an insulated shield supporting an electrode for contacting a high voltage electrical conductor, the shield housing a high voltage resistor connected in series with the electrode and a capacitance, formed by metallic collars, across the high voltage resistor to compensate for stray capacitance across the high voltage resistor; and
   a meter comprising a housing enclosing an electrical circuit for measuring phasing voltage, the electrical circuit measuring voltage across the electrodes and providing an output representing phasing voltage.

2. The phasing voltage meter of claim 1 wherein the capacitance comprises a first metallic collar at one end of the high voltage resistor and a second metallic collar at an opposite end of the high voltage resistor.

3. The phasing voltage meter of claim 2 wherein the first metallic collar is of a different size than the second metallic collar.

4. The phasing voltage meter of claim 2 wherein the first metallic collar is larger than the second metallic collar.

5. The phasing voltage meter of claim 2 wherein the first metallic collar has a greater diameter than the second metallic collar.

6. The phasing voltage meter of claim 2 wherein the first metallic collar has a greater thickness than the second metallic collar.

7. The phasing voltage meter of claim 2 wherein the first metallic collar and the second metallic collar support the high voltage resistor in the shield.

8. The phasing voltage meter of claim 1 wherein each probe comprises a handle portion at a near end of the shield selectively connected to an insulating hot stick.

9. The phasing voltage meter of claim 8 wherein the meter housing is integral with the handle portion of the first probe.

10. The phasing voltage meter of claim 2 wherein the first and second metallic collars are secured in the shield with a potting compound.

11. A high voltage phasing meter comprising:
   a first probe comprising an elongate insulated shield having a handle portion at one end, an electrode extending from a distal end of the insulated shield for contacting a high voltage electrical conductor, and a high impedance circuit in the shield comprising a high voltage resistor and a capacitance, formed by metallic collars, across the high voltage resistor to provide uniform current through each section of the high voltage resistor;
   a second probe comprising an elongate insulated shield having a handle portion at one end, an electrode extending from a distal end of the shield for contacting a high voltage electrical conductor, and a high impedance circuit in the shield comprising a high voltage resistor and a capacitance, formed by metallic collars, across the high voltage resistor to provide uniform current through each section of the high voltage resistor; and
   a meter comprising a housing enclosing an electrical circuit for measuring phasing voltage, the electrical circuit measuring voltage across the electrodes and providing an output representing phasing voltage.

12. The high voltage phasing meter of claim 11 wherein the capacitance comprises a first metallic collar at one end of the high voltage resistor and a second metallic collar at an opposite end of the high voltage resistor.

13. The high voltage phasing meter of claim 12 wherein the first metallic collar is of a different size than the second metallic collar.

14. The high voltage phasing meter of claim 12 wherein the first metallic collar is larger than the second metallic collar.

15. The high voltage phasing meter of claim 12 wherein the first metallic collar has a greater diameter than the second metallic collar.

16. The high voltage phasing meter of claim 12 wherein the first metallic collar has a greater thickness than the second metallic collar.

17. The high voltage phasing meter of claim 12 wherein the first metallic collar and the second metallic collar support the high voltage resistor in the insulated shield.

18. The high voltage phasing meter of claim 11 wherein each probe comprises a handle portion at a near end of the shield selectively connected to an insulating hot stick.

19. The high voltage phasing meter of claim 18 wherein the meter housing is integral with the handle portion of the first probe.

20. The high voltage phasing meter of claim 12 wherein the first and second metallic collars are secured in the shield with a potting compound.

* * * * *